United States Patent
Sakai et al.

(10) Patent No.: US 8,212,277 B2
(45) Date of Patent: Jul. 3, 2012

(54) OPTICAL SEMICONDUCTOR DEVICE MODULE WITH POWER SUPPLY THROUGH UNEVEN CONTACTS

(75) Inventors: Takaaki Sakai, Chiba (JP); Norifumi Imazeki, Kanagawa (JP); Soji Owada, Kanagawa (JP)

(73) Assignee: Stanley Electric Co., Ltd., Tokyo (JP)

( * ) Notice: Subject to any disclaimer, the term of this patent is extended or adjusted under 35 U.S.C. 154(b) by 397 days.

(21) Appl. No.: 12/510,526

(22) Filed: Jul. 28, 2009

(65) Prior Publication Data

US 2010/0044745 A1 Feb. 25, 2010

(30) Foreign Application Priority Data

Jul. 29, 2008 (JP) ................................. 2008-194423
Oct. 23, 2008 (JP) ................................. 2008-272670

(51) Int. Cl.
*H01L 33/00* (2010.01)

(52) U.S. Cl. .................. 257/99; 257/691; 257/E33.056; 362/507; 362/549; 362/647

(58) Field of Classification Search .................... 257/99, 257/676, 688, 691–693, 727, E33.056–E33.058, 257/E33.065; 362/544, 545, 548, 507, 538, 362/549, 800, 647, 519; 361/760; 439/56, 439/557, 558, 699.2, 715–717
See application file for complete search history.

(56) References Cited

U.S. PATENT DOCUMENTS

| | | | |
|---|---|---|---|
| 7,284,882 B2 * | 10/2007 | Burkholder | 362/294 |
| 8,030,678 B2 * | 10/2011 | Sakai et al. | 257/99 |
| 2002/0167017 A1 * | 11/2002 | Nakabayashi et al. | 257/98 |
| 2004/0246543 A1 * | 12/2004 | Kurokawa et al. | 358/509 |
| 2005/0180157 A1 * | 8/2005 | Watanabe et al. | 362/543 |
| 2007/0109806 A1 * | 5/2007 | Tsukamoto et al. | 362/545 |
| 2007/0170452 A1 * | 7/2007 | Kurokawa et al. | 257/99 |
| 2007/0171667 A1 * | 7/2007 | Watanabe et al. | 362/545 |
| 2007/0187708 A1 * | 8/2007 | Setomoto et al. | 257/99 |
| 2008/0160823 A1 * | 7/2008 | Jocham et al. | 439/404 |

FOREIGN PATENT DOCUMENTS

| | | | |
|---|---|---|---|
| JP | 08-222838 A | * | 8/1996 |
| JP | 08-222838 A | | 8/1996 |
| JP | 2005-209518 A | | 8/2005 |
| JP | 2006-300877 A | | 11/2006 |
| JP | 2007-194172 A | | 8/2007 |
| JP | 2007-200697 A | | 8/2007 |
| JP | 2007-207594 A | | 8/2007 |
| JP | 2007-207594 A | * | 8/2007 |
| JP | 2007-242267 A | | 9/2007 |

* cited by examiner

*Primary Examiner* — Matthew Landau
*Assistant Examiner* — Joseph C Nicely
(74) *Attorney, Agent, or Firm* — Kenealy Vaidya LLP

(57) ABSTRACT

In an optical semiconductor device module constructed by an optical semiconductor device having a light emitting portion on its top surface, a mounting substrate adapted to mount the optical semiconductor device thereon, at least one wiring pattern layer formed on a front surface of the mounting substrate, and at least one power supplying portion in contact with the wiring pattern layer, at least one of the power supplying portion and the wiring pattern layer is uneven.

16 Claims, 18 Drawing Sheets

OPTICAL SEMICONDUCTOR DEVICE MODULE WITH POWER SUPPLY THROUGH UNEVEN CONTACTS

This application claims the priority benefit under 35 U.S.C. §119 to Japanese Patent Application Nos. JP2008-194423 filed on 28 Jul. 2008 and JP2008-272670 filed on 23 Oct. 2008, the disclosures of which are hereby incorporated in their entirety by reference.

BACKGROUND

1. Field

The presently disclosed subject matter relates to an optical semiconductor device module used in a head lamp or the like of a vehicle.

2. Description of the Related Art

Generally, in the same way as a chip resistor module and a chip capacitor module, an optical semiconductor device module or a light emitting diode (LED) module mounted on a vehicle is constructed by fixing an LED element and a coupler for leads to a mounting substrate. In this case, conductive terminals of the coupler are fixed to the mounting substrate using solder portions, screws or spot welds, which will be explained later in detail.

However, when the conductive terminals of the coupler are fixed directly to the mounting substrate using solder portions, screws or spot welds, cracks could occur in the solder portions, the conductive terminals could be deformed, or the coupler could be separated from the mounting substrate. This also will be explained later in detail.

Instead of directly processing or deforming conductive terminals of a coupler, other approaches are to put male terminals of a coupler onto female terminals of a mounting substrate (see: JP-2007-194172A), to sandwich a mounting substrate by clips of a coupler (see: JP-2007-207594A), to fix a coupler by an attachment to a mounting substrate (see: JP-2007-242267A), or to fix a coupler by leaf springs to a mounting substrate (see: JP-2007-200697A), thus supplying power from the coupler to the mounting substrate.

However, when the coupler is fixed to the mounting substrate by the coupling of the male terminals and the female terminals, the contact area between the male terminals and the female terminals cannot be increased, so that the male terminals on the mounting substrate could be separated therefrom. Also, in the coupler fixed by the clips on the attachment, the clips or the attachment may vibrate due to vibration of a vehicle, so that the LED element could be turned OFF. Further, when the coupler is fixed by the leaf springs, the leaf springs could be weakened under a high temperature state and the electrical contact therebetween could be weakened with time due to the one-point contact. In any case, lightening and darkening of the LED element may occur repeatedly.

Note that JP-2006-300877A discloses a measuring adapter for connecting alligator clips to a voltmeter, and JP-2005-209518A discloses a female terminal having rear side protrusions and front side protrusions providing two or more points of contact.

SUMMARY

The presently disclosed subject matter seeks to solve one or more of the above-described problems.

According to the presently disclosed subject matter, in an optical semiconductor device module constructed by an optical semiconductor device having a light emitting portion on its top surface, a mounting substrate adapted to mount the optical semiconductor device thereon, at least one wiring pattern layer formed on a front surface of the mounting substrate, and at least one power supplying portion in contact with the wiring pattern layer, at least one of the power supplying portion and the wiring pattern layer is uneven. As a result, the power supplying portion is securely fixed by two or more contact points to the wiring pattern layer, thus exhibiting an excellent electrical connection therebetween. Also, the power supplying portion includes a metal film on its surface, and the wiring pattern layer includes another metal film on its surface. The material of the two metal films is the same so that the power supplying portion and the wiring pattern layer are combined by metal diffusion therebetween.

BRIEF DESCRIPTION OF THE DRAWINGS

The above and other advantages and features of the present invention will be more apparent from the following description of certain embodiments, as compared with the prior art, taken in conjunction with the accompanying drawings, wherein.

DETAILED DESCRIPTION OF EMBODIMENTS

Before the description of embodiments, a prior art optical semiconductor device module will now be explained with reference to FIGS. 1A and 1B.

Figure 1A:
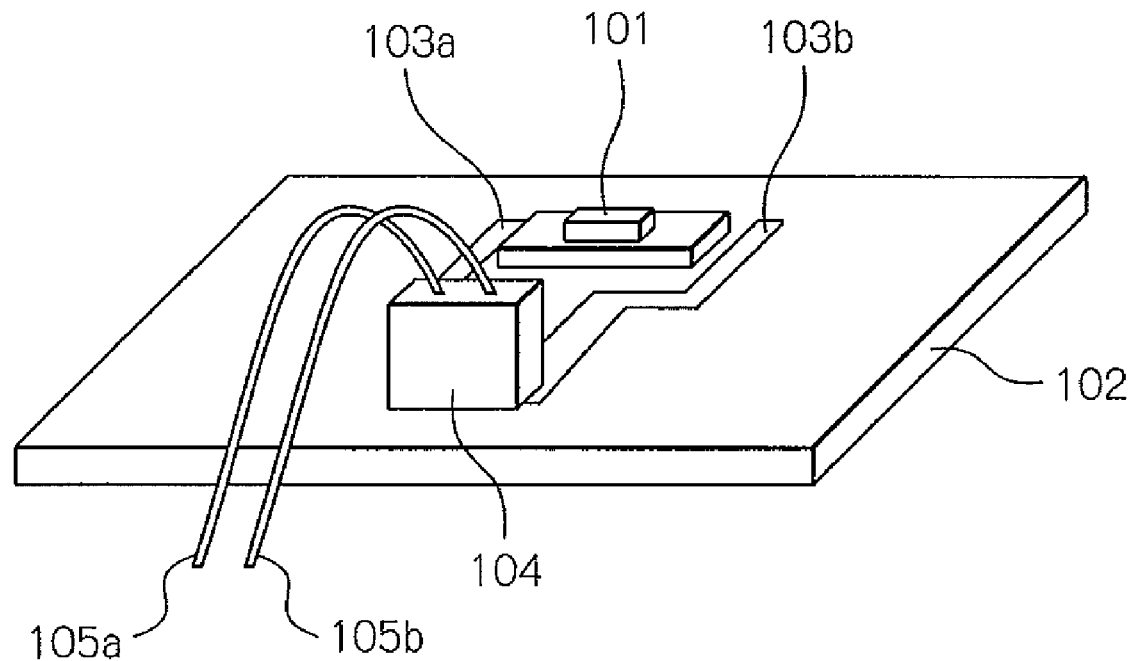
FIG. 1A is a perspective view illustrating a prior art optical semiconductor device module.

In FIG. 1A, which illustrates a prior art optical semiconductor device module, an LED element 101 along with lead frames (not shown) is mounted on a mounting substrate 102, and then, the lead frames are connected to wiring pattern layers 103a and 103b of the mounting substrate 102 by bonding Au bonding wires or Al wedges (not shown). Also, a coupler (connector) 104 along with leads 105a and 105b is mounted on the mounting substrate 102.

Figure 1B:
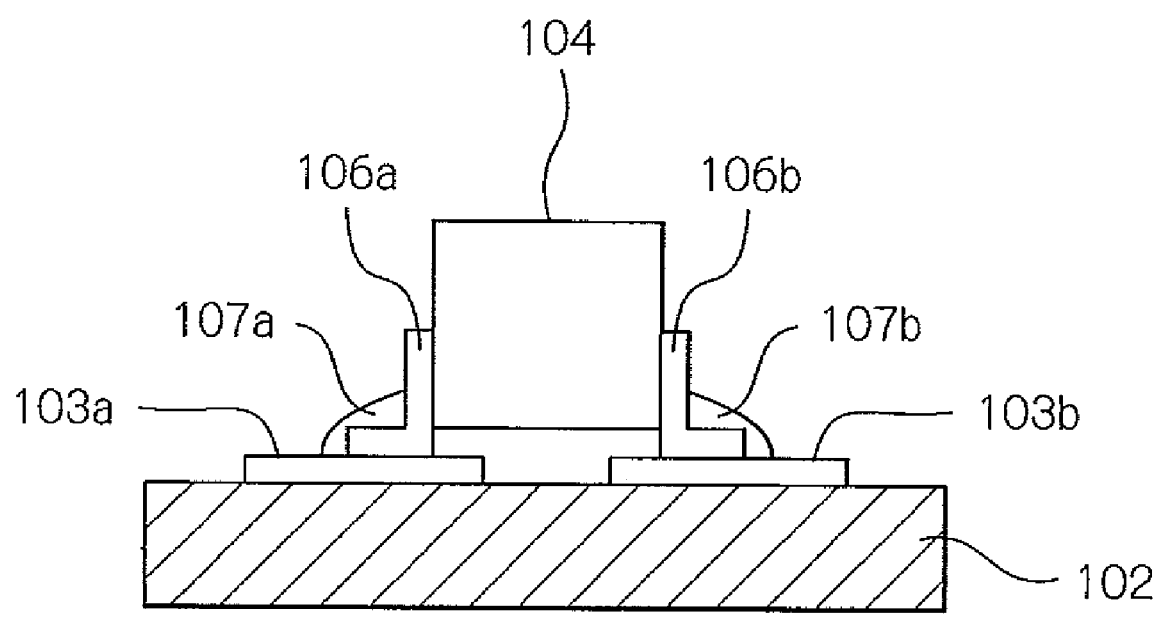
FIG. 1B is a cross-sectional view illustrating a detailed mounting structure of the coupler of FIG. 1A.

As illustrated in FIG. 1B, which illustrates a detailed mounting structure of the coupler 104 of FIG. 1A, conductive terminals 106a and 106b of the coupler 104 are fixed to the mounting substrate 102 by solder portions 107a and 107b, respectively.

Note that the conductive terminals 106a and 106b of the coupler 104 can be fixed to the mounting substrate 102 by screws or spot welds.

In the optical semiconductor device module of FIGS. 1A and 1B, however, when a heat load test is carried out, cracks would occur in a connection portion of the solder portions 107a and 107b to the coupler 104 and the mounting substrate 102 due to the difference in linear thermal expansion coefficient between the coupler 104 and the mounting substrate 102. Also, when the optical semiconductor device module of FIGS. 1A and 1B is mounted at a position in the proximity of an engine, metal diffusion would occur between the conductive terminals 106a and 106b of the coupler 104 and the solder portions 107a and 107b in a high temperature environment, to create an intermetallic compound therebetween. Since such an intermetallic compound is mechanically weak, cracks would occur in the solder portions 107a and 107b due to the vibration and impact. As a result, the LED element 101 would be darkened due to the shortage of supplied power, and the heat dissipating characteristics of the LED element 101 would deteriorate. At worst, the coupler 104 would be separated from the mounting substrate 102. Note that Pb-free soldering has been developed for components of vehicles.

Also, if screws are provided instead of the solder portions 107a and 107b of FIG. 1B, the rotational torques of the screws are applied to the conductive terminals 106a and 106b, respectively, so that the conductive terminals 106a and 106b would be deformed. As a result, the LED element 101 would be darkened due to the shortage of supplied power.

If spot welds are provided instead of the solder portions 107a and 107b of FIG. 1B, the conductive terminals 106a and 106b can be firmly secured to the mounting substrate 102. However, it is more difficult to exchange the coupler 104 with a new one, as compared with the optical semiconductor device modules where the solder portions or the screws are used.

Figure 2:
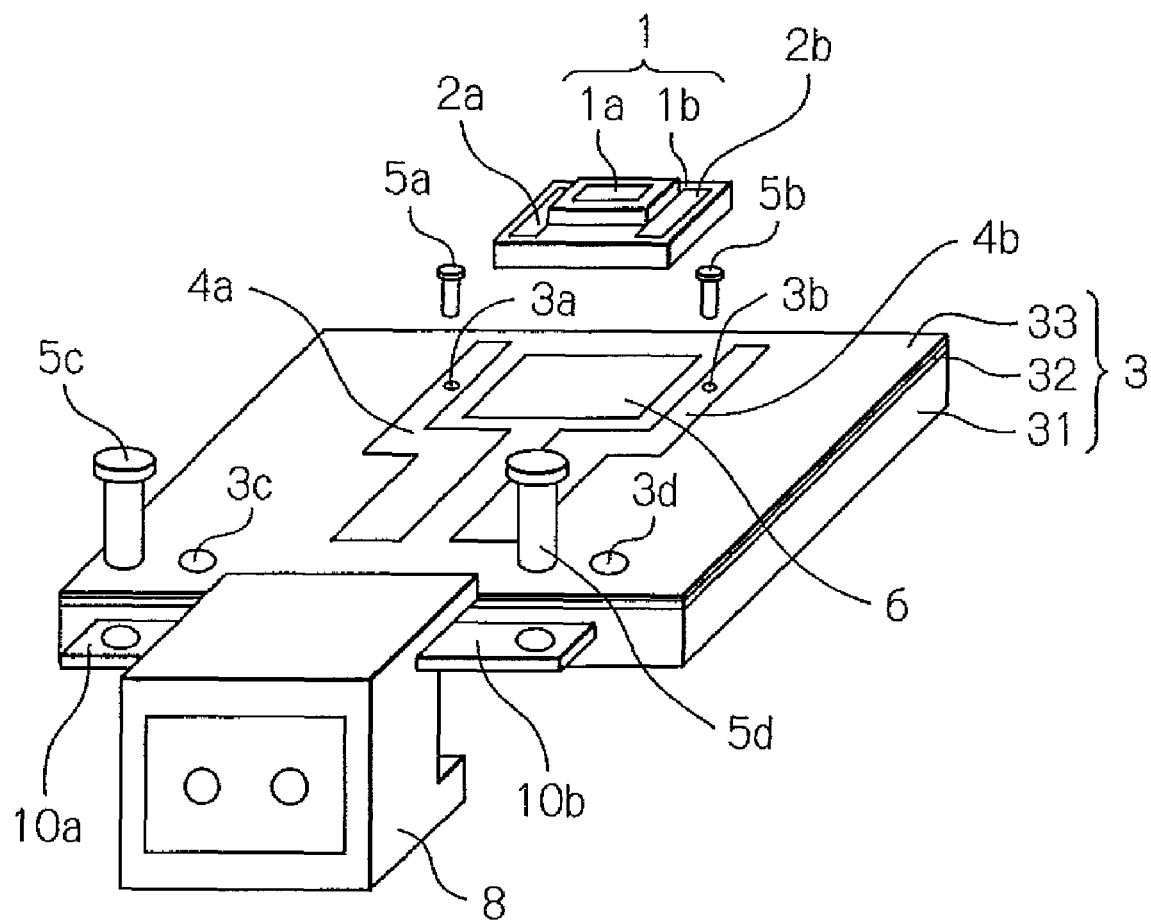
FIG. 2 is an exploded, perspective view illustrating a first embodiment of the optical semiconductor device module according to the presently disclosed subject matter.
Figure 3:
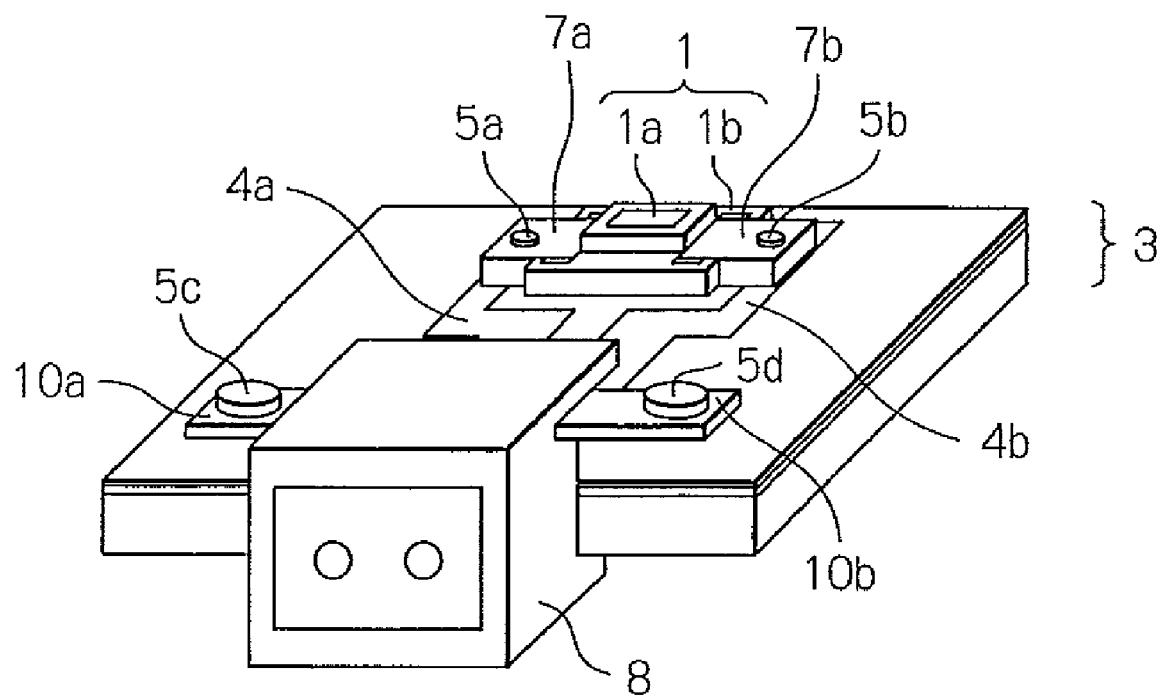
FIG. 3 is an assembled, perspective view of the optical semiconductor device module of FIG. 2.

FIG. 2 is an exploded, perspective view illustrating a first embodiment of the optical semiconductor device module according to the presently disclosed subject matter, and FIG. 3 is an assembled, perspective view of the optical semiconductor device module of FIG. 2.

Referring to FIGS. 2 and 3, an LED element 1 has a light emitting portion 1a on its top surface side and a support body 1b on its back surface side.

Lead frames 2a and 2b are formed on the support body 1b of the LED element 1 and are connected to an anode and a cathode, respectively, of the LED element 1 by Au bonding wires or Al wedges.

A mounting substrate 3 is used for mounting the LED element 1. The mounting substrate 3 is constructed by a metal substrate 31 made of Cu or Al which has excellent workability and mass-productivity, an insulating layer 32 and a resist layer 33.

The insulating layer 32 is made of thermoplastic resin such as polyether-imid or polyether-ether ketone, or thermosetting resin such as epoxy resin or polyimide resin. As occasion demands, reinforcing glass fiber may be added thereinto.

Provided at openings of the resist layer 33 are about 35 to 100 μm thick wiring pattern layers 4a and 4b which are made of Cu or its alloy coated by a plating film made of Au, Sn or their alloy.

Also, tapped holes 3a, 3b, 3c and 3d for receiving screws 5a, 5b, 5c and 5d, respectively, are perforated in the mounting substrate 3.

Note that the mounting substrate 3 can include a heat dissipating body such as a heat sink.

Also, an opening is perforated in the resist layer 33 and the insulating layer 32. Then, a silicone heat dissipating grease layer 6 is coated in this opening of the resist layer 33 and the insulating layer 32 of the mounting substrate 3. That is, when the LED element 1 is mounted on the mounting substrate 3, heat is dissipated from the LED element 1 via the silicone heat dissipating grease layer 6 to the metal substrate 31 of the mounting substrate 3.

Conductive leaf springs 7a and 7b (shown not in FIG. 2, but in FIG. 3) are used for fixing the LED element 1 to the mounting substrate 3 to supply power from the leaf springs 7a and 7b to the LED element 1.

The leaf springs 7a and 7b are fixed by the screws 5a and 5b, respectively, to the mounting substrate 3. In this case, the screws 5a and 5b are coated by insulating material (not shown).

The upper surfaces of the leaf springs 7a and 7b are lower than the upper surface of the light emitting portion 1a of the LED element 1, so that the light distribution characteristics of the LED element 1 are not affected by the leaf springs 7a and 7b.

Also, the leaf springs 7a and 7b, particularly their spring portions, can be made as thin as possible, so that the leaf springs 7a and 7b provide an excellent spring function.

Note that bonding wires made of Au or Al can be used instead of the leaf springs 7a and 7b.

The mounting substrate 3 is pressed into the coupler 8, so that the coupler 8 sandwiches the mounting substrate 3, thus securely fixing the coupler 8 to the mounting substrate 3. In this case, the coupler 8 is fixed to the mounting substrate 3 by inserting insulating screws 5c and 5d into the tapped holes 3c and 3d, respectively, of the mounting substrate 3 through stationary members (brackets) 10a and 10b which are made of heat-resistant resin or metal.

Figure 4:
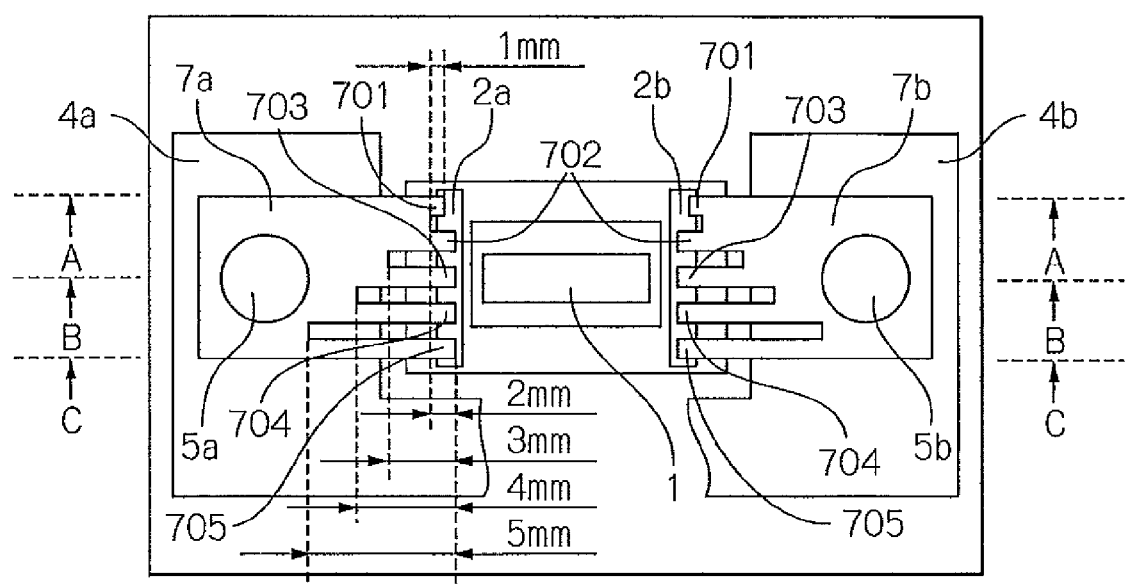
FIG. 4 is a plan view of the optical semiconductor device module of FIG. 3.
Figure 5A:
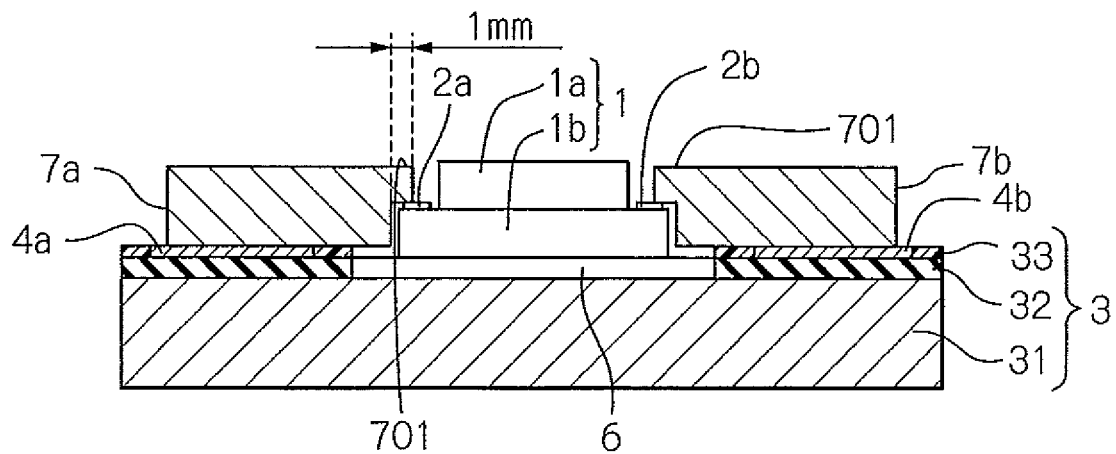
FIGS. 5A, 5B and 5C are cross-sectional views taken along the lines A-A, B-B and C-C, respectively, of FIG. 4.
Figure 5B:
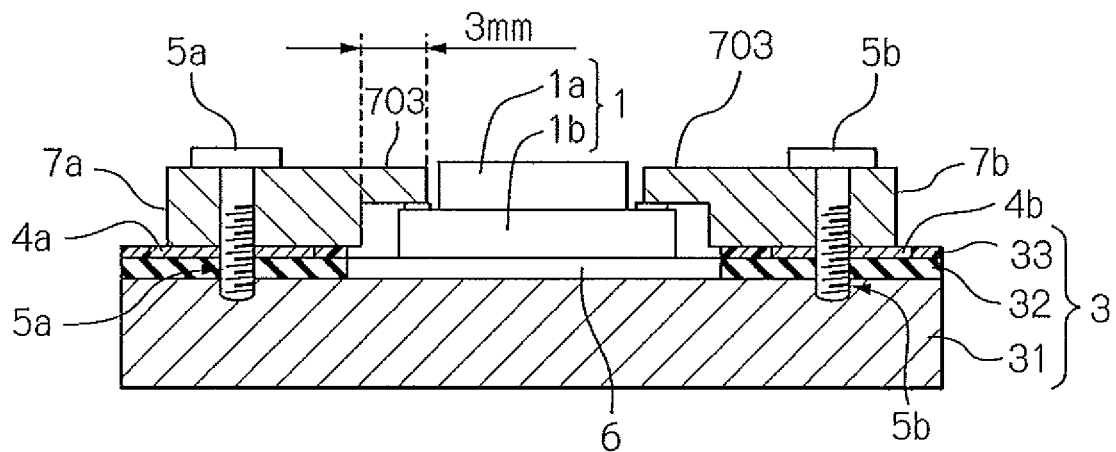
Figure 5C:
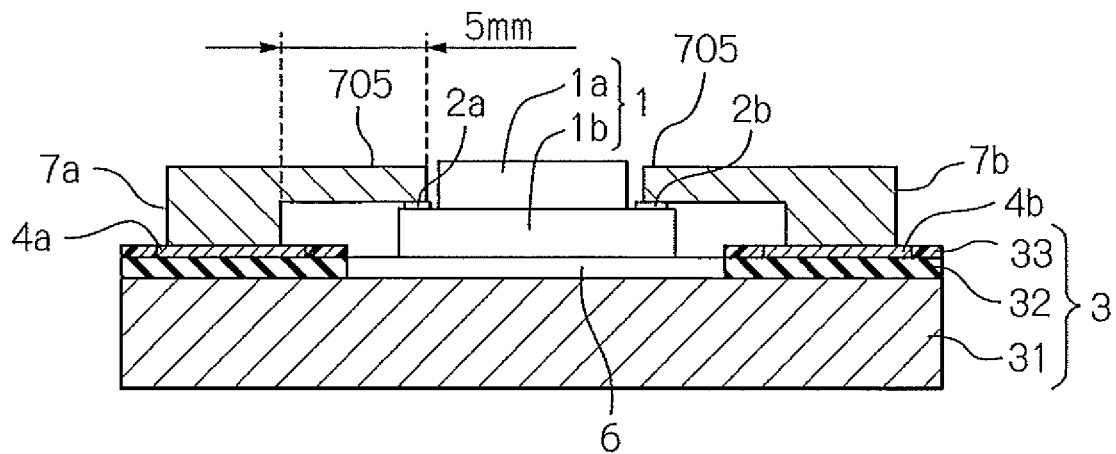

FIG. 4 is a plan view of the optical semiconductor device module of FIG. 2 for explaining the leaf springs 7a and 7b thereof, and FIGS. 5A, 5B and 5C are cross-sectional views taken along the lines A-A, B-B and C-C, respectively, of FIG. 4.

As illustrated in FIGS. 4, 5A, 5B and 5C, each of the leaf springs 7a and 7b is constructed by five rectangularly-shaped terminals 701, 702, 703, 704 and 705, each serving as a spring member. The lengths L1, L2, L3, L4 and L5 of the rectangularly-shaped terminals 701, 702, 703, 704 and 705 are different from each other. For example, L1=1 mm
L2=2 mm
L3=3 mm
L4=4 mm
L5=5 mm.

Therefore, the natural frequencies of the rectangularly-shaped terminals 701, 702, 703, 704 and 705 are different from each other. Here, since each rectangularly-shaped terminal has a fixed end and a support beam end, a natural frequency f of the rectangularly-shaped terminal is calculated by $$f = kn2/2\pi L2 \times (EI/\rho A)^{1/2} \qquad (1)$$

where kn is an n-th order oscillation constant, for example, k1=3.927, k2=7.069, k3=10.210, . . . ;

L is a length of the rectangularly-shaped terminal;
E is a Young's modulus of the rectangularly-shaped terminal;
I is a geometrical moment of inertia of the rectangularly-shaped terminal;
ρ is a density of the rectangularly-shaped terminal; and
A is a cross section of the rectangularly-shaped terminal.
Therefore, if the rectangularly-shaped terminals 701, 702, 703, 704 and 705 are made of copper (Cu) and have the same thickness of 1 mm and the same width of 1 mm, and the following conditions are satisfied:

$$L2 = 1.8 L1 \qquad (2)$$

$$L3 = 2.6 L1 \qquad (3)$$

$$L4 = 3.4 L1 \qquad (4)$$

$$L5 = 4.2 L1 \qquad (5).$$

Then, the rectangularly-shaped terminals 701, 702, 703, 704 and 705 simultaneously vibrate, i.e., resonate, to repeatedly lighten and darken the LED element 1. At worst, the LED element 1 would be separated from the mounting substrate 3. However, in the optical semiconductor device module of FIG. 4, since L1=1 mm, L2=2 mm, L3=3 mm, L4=4 mm and L5=5 mm, the formulae (2), (3), (4) and (5) are never satisfied, which would suppress the vibration (resonance) of the rectangularly-shaped terminals 701, 702, 703, 704 and 705. Therefore, repeated lightening and darkening of the LED element 1 and separation of the LED element 1 from the mounting substrate 3 can be prevented.

Note that the rectangularly-shaped terminals 701, 702, 703, 704 and 705 of the leaf springs 7a and 7b can be formed by perforating openings in one leaf spring.

In FIG. 4, in each of the leaf springs 7a and 7b, only when the lengths of at least two rectangularly-shaped terminals are different from each other, can the vibration of the leaf springs 7a and 7b be prevented.

In FIG. 4, if the lengths of the rectangularly-shaped terminals 701, 702, 703, 704 and 705 of the leaf spring 7a are symmetrical to those of the rectangularly-shaped terminals 701, 702, 703, 704 and 705 of the leaf spring 7b with respect to the LED element 1, when one of the rectangularly-shaped terminals vibrates, although its diagonally positioned rectangularly-shaped terminal simultaneously vibrates, i.e., resonates, the other rectangularly-shaped terminals never simultaneously vibrate, i.e., never resonate. Thus, the vibration of the leaf springs 7a and 7b can be suppressed.

In FIG. 4, in each of the leaf springs 7a and 7b, if the materials of the rectangularly-shaped terminals 701, 702, 703, 704 and 705 are different from each other, for example, in view of workability and conductivity,

701: copper (Cu)
702: aluminum (Al)
703: SUS304
704: gold (Au)
705: silver (Ag), the Young's moduluses E are different (see: formula (1)), the natural frequencies of the rectangularly-shaped terminals 701, 702, 703, 704 and 705 are different from each other, so that the vibration (resonance) of the rectangularly-shaped terminals 701, 702, 703, 704 and 705 can be suppressed. In this case, only when the materials of at least two rectangularly-shaped terminals are different from each other, can the vibration of the leaf springs 7a and 7b be prevented.

Also, if the materials of the rectangularly-shaped terminals 701, 702, 703, 704 and 705 of the leaf spring 7a are symmetrical to the materials of the rectangularly-shaped terminals 701, 702, 703, 704 and 705 of the leaf spring 7b with respect to the LED element 1, in each of the leaf springs 7a and 7b, when one of the rectangularly-shaped terminals vibrates, although its diagonally positioned rectangularly-shaped terminal simultaneously vibrates, the other rectangularly-shaped terminals never simultaneously vibrate, i.e., never resonate, so that the vibration of the leaf springs 7a and 7b can be suppressed.

In FIG. 4, when the materials of the rectangularly-shaped terminals are varied, the rectangularly-shaped terminals are bonded to the body of each of the leaf springs 7a and 7b by welds or brazing. In this case, plating material or its thickness can be changed instead of changing the materials of the rectangularly-shaped terminals. That is, the difference of plating material or its thickness makes the Young modulus E or the density in the formula (1) different, which makes the natural frequency f in the formula (1) different.

Also, in the above-described first embodiment, geometrical shapes such as thicknesses or cross sections of the rectangularly-shaped terminals can be varied instead of changing the materials of the rectangularly-shaped terminals, which makes geometrical moment I of inertia of the rectangularly-shaped terminals or the cross sections A in the formula (1) different, which also makes the natural frequencies f in the formula (1) different.

In FIGS. 2 and 3, rivets, press pins, or hooks can be used instead of the screws 5a and 5b.

Figure 6A:
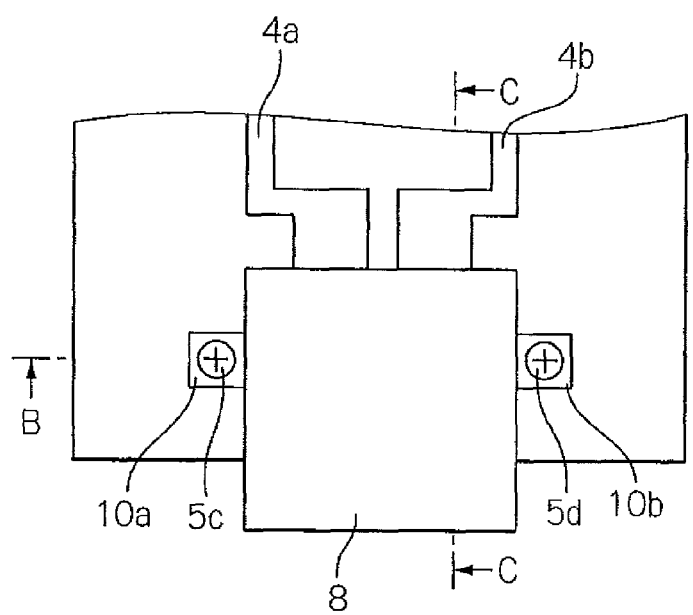
FIG. 6A is a plan view of the optical semiconductor device module of FIG. 3 in the vicinity of the coupler.
Figure 6C:
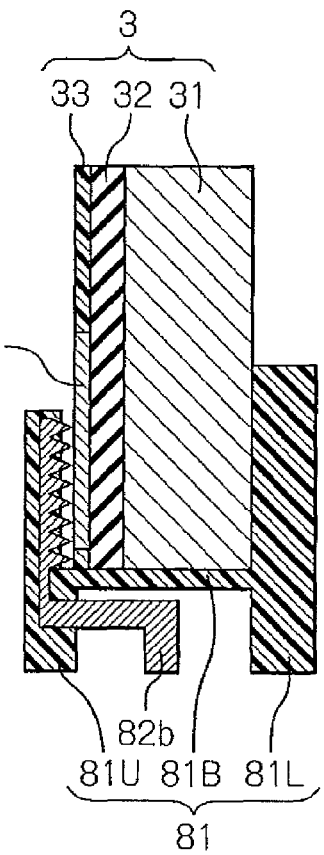
FIG. 6C is a cross-sectional view taken along the line C-C of FIG. 6A.
Figure 6B:
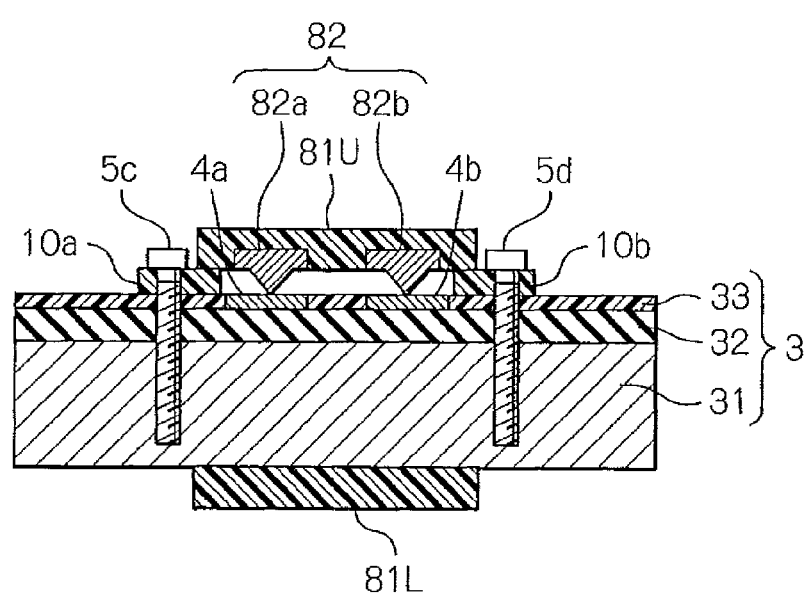
FIG. 6B is a cross-sectional view taken along the line B-B of FIG. 6A.

FIG. 6A is a plan view of the optical semiconductor device module of FIG. 3 in the vicinity of the coupler 8, FIG. 6B is a cross-sectional view taken along the line B-B of FIG. 6A, and FIG. 6C is a cross-sectional view taken along the line C-C of FIG. 6A.

As illustrated in FIGS. 6A, 6B and 6C, the coupler 8 is constructed by a housing 81 formed by an upper portion 81U, a lower portion 81L and a bottom portion 81B connecting the upper portion 81U to the lower portion 81L, and power supplying uneven portions 82a and 82b fixed to the upper portion 81U. In this case, the power supplying uneven portions 82a and 82b have isosceles triangular cross sections.

The housing 81 is made of non-conductive, heat-resistant material such as resin or ceramic. For example, polyphenylene sulfide (PPS), polycarbonate or Kapton (trademark) is used as such resin, and alumina or AlN is used as such ceramic.

The power supplying uneven portions 82a and 82b are made of cushioning and conductive Cu alloy such as phosphor bronze or brass coated by a plating film made of Au, Sn or their alloy. Each of the power supplying uneven portions 82a and 82b has an uneven surface with a roughness on the order of 0.1 mm which is formed in advance by a circular trimming machine, a molding pressing machine or an injection machine. For example, each of the power supplying uneven portions 82a and 82b has approximately isosceles triangular cross sections.

The power supplying uneven portions 82a and 82b is molding-formed with the resin or ceramic of the housing 81, or is inserted thereinto.

When the mounting substrate 3 is pressed into the coupler 8, the oxide coated layer of the wiring pattern layers 4a and 4b and the oxide coated layer of the power supplying uneven portions 82a and 82b could break, so that metal diffusion would occur between the Au, Sn or their alloy of the wiring pattern layers 4a and 4b and that of the power supplying uneven portions 82a and 82b due to the frictional heat. In this case, the above-mentioned metal diffusion is enhanced by the cushioning characteristics of the power supplying uneven portions 82a and 82b to further press the power supplying uneven portions 82a and 82b against the wiring pattern layers 4a and 4b, respectively.

Although Au has a high melting point of 1064° C., Au has a large self-diffusion coefficient, so that Au is easily metallically-diffused. Particularly, when metal diffusion occurs between two Au layers, the two Au layers are securely combined with each other and are not affected by a high temperature, and also, cracks caused by the heat shocks can be suppressed. On the other hand, since Sn has a low melting point of 232° C. and a large self-diffusion coefficient, Sn is easily metallically-diffused.

In view of this, when the wiring pattern layers 4a and 4b are made of Au and the power supplying uneven portions 82a and 82b are plated by Au, the above-mentioned metal diffusion can be enhanced.

The above-mentioned metal diffusion can further be enhanced by performing an annealing operation at a temperature of about 150° C. for several hours upon the mounting substrate 3 inserted into the coupler 8.

In the optical semiconductor device module of FIGS. 2 and 3, since the electrical connection of the coupler 8 to the mounting substrate 3 is carried out by uneven contacts due to the power supplying uneven portions 82a and 82b, and the mechanical fixation of the coupler 8 to the mounting substrate 3 is carried out by the screws 5c and 5d, the defective contact of the coupler 8 to the mounting substrate 3 can be avoided, so that the coupler 8 is hardly separated from the mounting substrate 3, thus carrying out a highly reliable power supply.

Figure 7A:
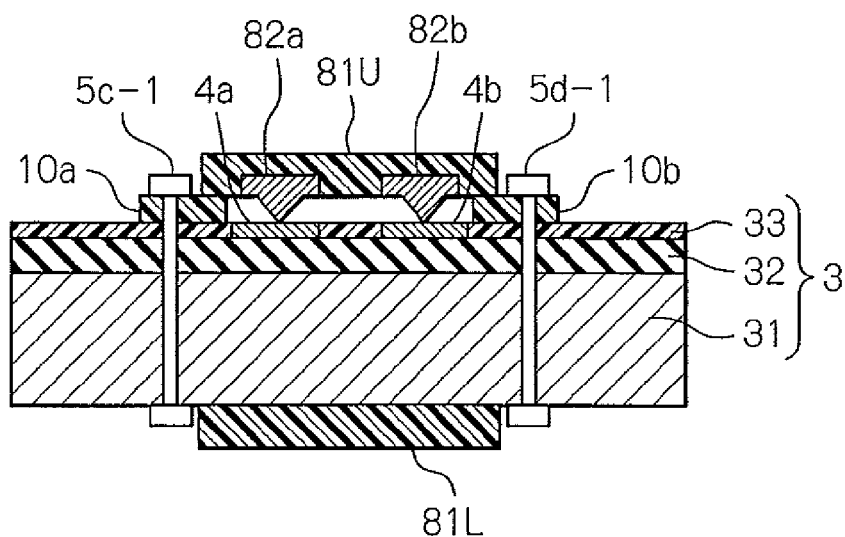
FIGS. 7A, 7B and 7C are cross-sectional views of modifications of FIG. 6B.
Figure 7B:
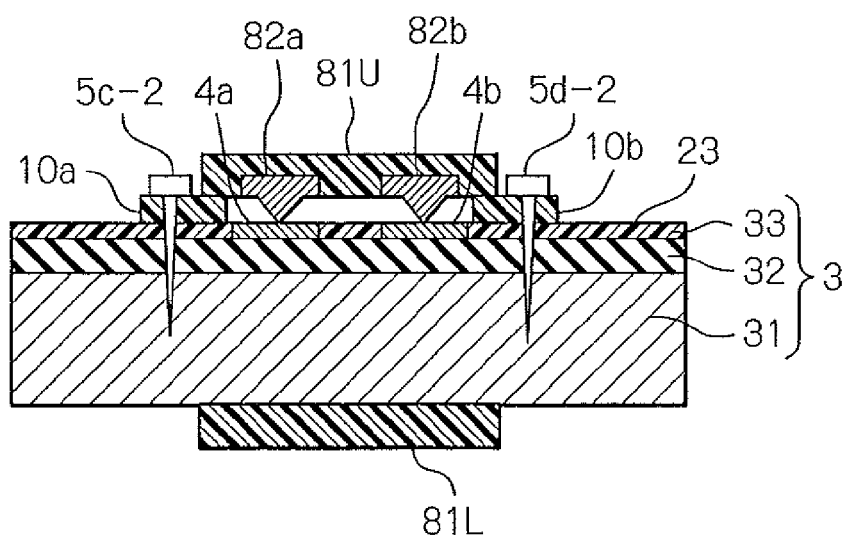
Figure 7C:
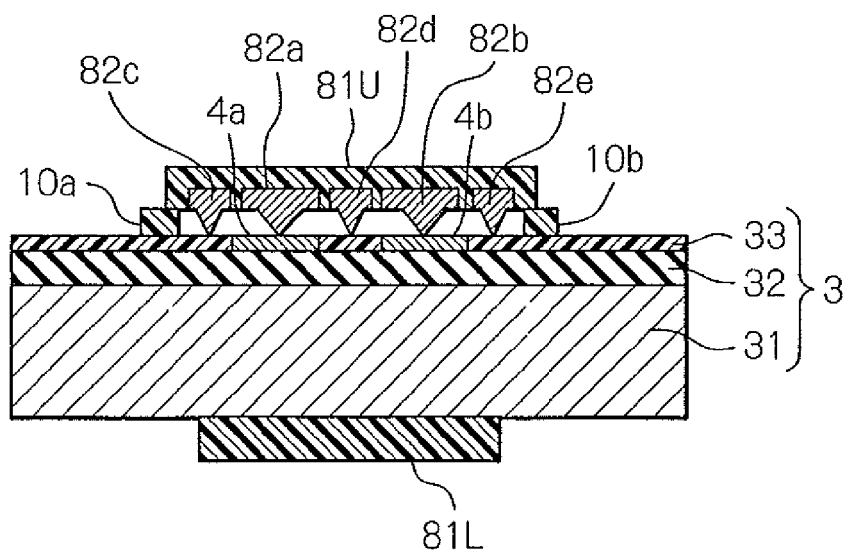

In the above-described first embodiment, as illustrated in FIG. 7A, the screws 5c and 5d can be replaced by rivets 5c-1 and 5d-1, respectively. In this case, the rivets 5c-1 and 5d-1 are made of heat-resistant resin or metal. Also, as illustrated in FIG. 7B, the screws 5c and 5d can be replaced by press pins 5c-2 and 5d-2, respectively. Further, as illustrated in FIG. 7C, the screws 5c and 5d can be replaced by stationary uneven portions 82c, 82d and 82e, respectively. In FIG. 7C, the stationary uneven portions 82c, 82d and 82e are formed simultaneously with the formation of the power supplying uneven portions 82a and 82b. Therefore, the stationary uneven portions 82c, 82d and 82e are made of the same material as the power supplying uneven portions 82a and 82b; however, the stationary uneven portions 82c, 82d and 82e are not connected to the wiring pattern layers 4a and 4b.

Thus, the mechanical fixation of the coupler 8 to the mounting substrate 3 is carried out by the screws 5c and 5d, the rivets 5c-1 and 5d-1, the press pins 5c-2 and 5d-2, or the stationary uneven portions 82c, 82d and 82e.

Figure 8:
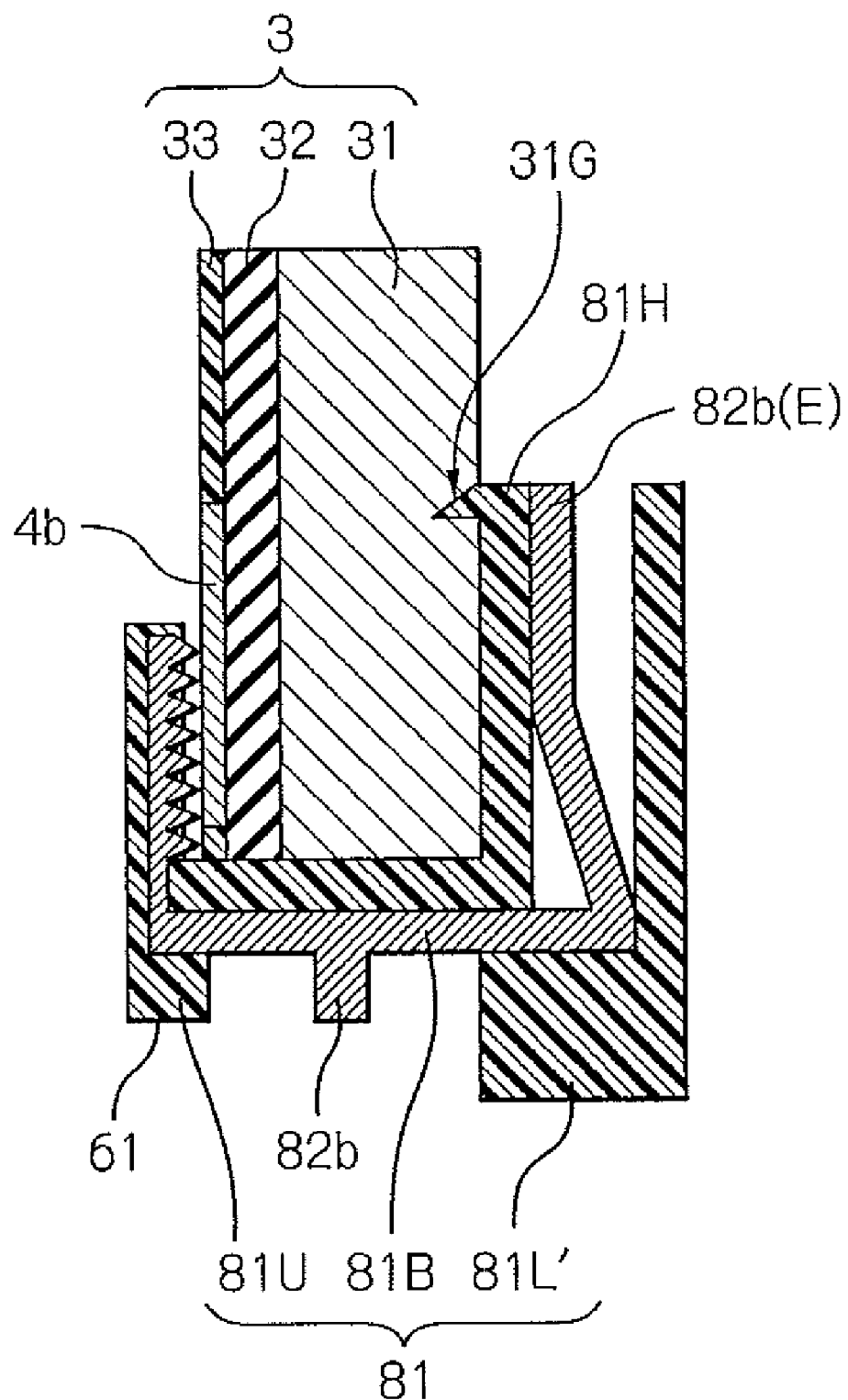
FIG. 8 is a cross-sectional view of a modification of FIG. 6C.

Also, in the above-described first embodiment, as illustrated in FIG. 8, the lower portion 81L of the housing 81 can be replaced by a lower portion 81L'. Also, a hook 81H is provided at the bottom portion 81B, and a groove 31G corresponding to the hook 81H is provided at the bottom of the metal substrate 31. As a result, the mechanical fixation of the coupler 8 to the mounting substrate 3 is carried out by pushing the hook 81H toward the groove 31G due to the cushioning characteristics of extensions such as 82b(E) of the power supplying uneven portions 82a and 82b.

Figure 9A:
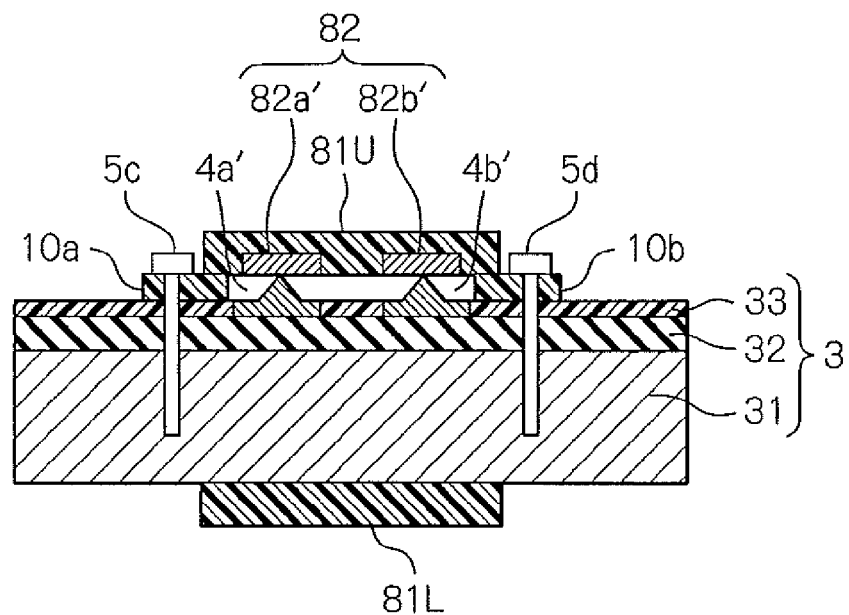
FIGS. 9A and 9B are cross-sectional views of modifications of FIGS. 6B and 6C, respectively.
Figure 9B:
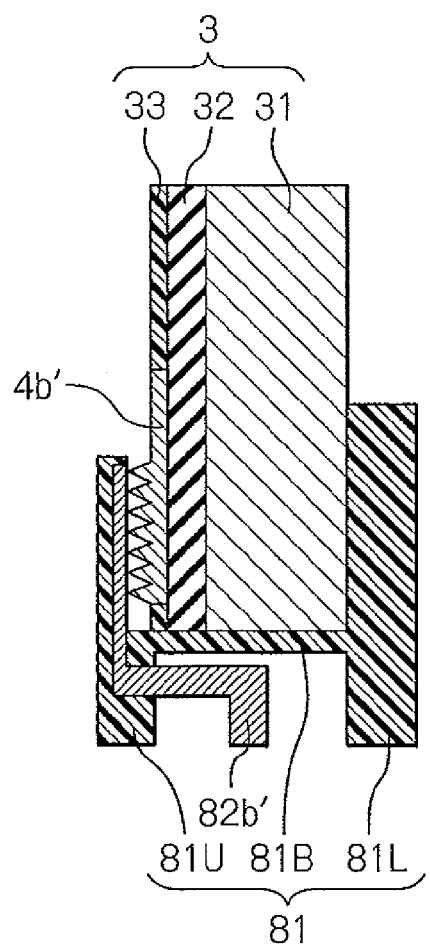

Further, in the above-described first embodiment, as illustrated in FIGS. 9A and 9B, the wiring pattern layers 4a and 4b can be replaced by uneven wiring pattern layers 4a' and 4b', respectively, while the power supplying uneven portions 82a and 82b can be replaced by power supplying even portions 82a' and 82b', respectively. Even in this case, the electrical connection of the coupler 8 to the mounting substrate 3 is carried out by uneven contacts due to the uneven wiring pattern layers 4a' and 4b'.

Figure 10A:
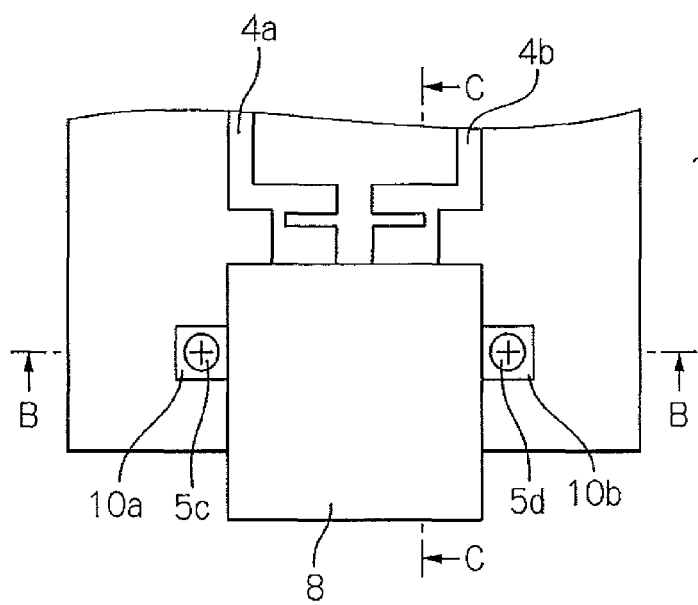
FIG. 10A is a plan view illustrating a second embodiment of the optical semiconductor device module according to the presently disclosed subject matter.
Figure 10C:
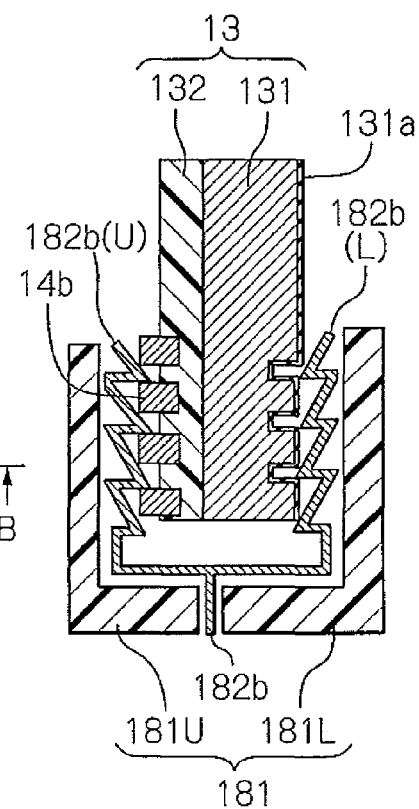
FIG. 10C is a cross-sectional view taken along the line C-C of FIG. 10A.
Figure 10B:
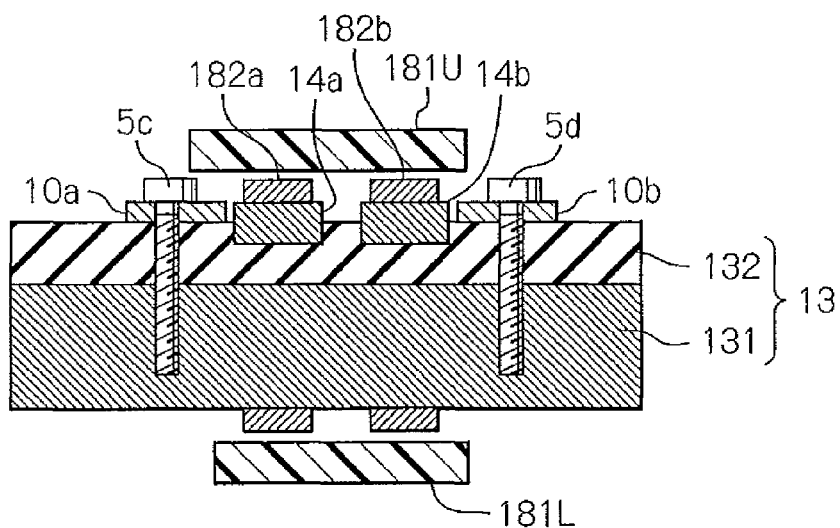
FIG. 10B is a cross-sectional view taken along the line B-B of FIG. 10A.

FIG. 10A is a plan view illustrating a second embodiment of the optical semiconductor device module according to the presently disclosed subject matter, FIG. 10B is a cross-sectional view taken along the line B-B of FIG. 10A, and FIG. 10C is a cross-sectional view taken along the line C-C of FIG. 10A. Note that FIGS. 10A, 10B and 10C correspond to FIGS. 6A, 6B and 6C, respectively. Therefore, FIGS. 10A, 10B and 10C illustrate only the vicinity of a coupler. In the second embodiment, note that the LED element 1 and the like are provided in the same way as in the first embodiment.

As illustrated in FIGS. 10A, 10B and 10C, a mounting substrate 13 is constructed by a metal substrate 131 and an insulating layer 132 corresponding to the metal substrate 31 and the insulating layer 32, respectively, of FIGS. 6A, 6B and 6C. Also, wiring pattern layers 14a and 14b corresponding to the wiring pattern layers 4a and 4b, respectively, of FIGS. 6A, 6B and 6C are provided. Further, a coupler 18 is constructed by a housing 181 formed by an upper portion 181U and a lower portion 181L corresponding to the upper portion 81U and the lower portion 81L, respectively, of FIGS. 6A, 6B and 6C, and power supplying uneven portions 182a and 182b corresponding to the power supplying uneven portions 82a and 82b, respectively, of FIGS. 6A, 6B and 6C. The power supplying uneven portions 182a (182b) are constructed by an upper power supplying uneven portion 182a(U) (182b(U)) and a lower power supplying uneven portion 182a(L) (182b(L)) on the sides of the upper portion 181U and the lower portion 181L, respectively, of the housing 181. In this case, the lower power supplying uneven portions 182a(L) and 182b(L) are electrically-isolated from the metal substrate 131 by an insulating layer 131a made of anodized aluminum by a plating or evaporating process.

Figure 11:
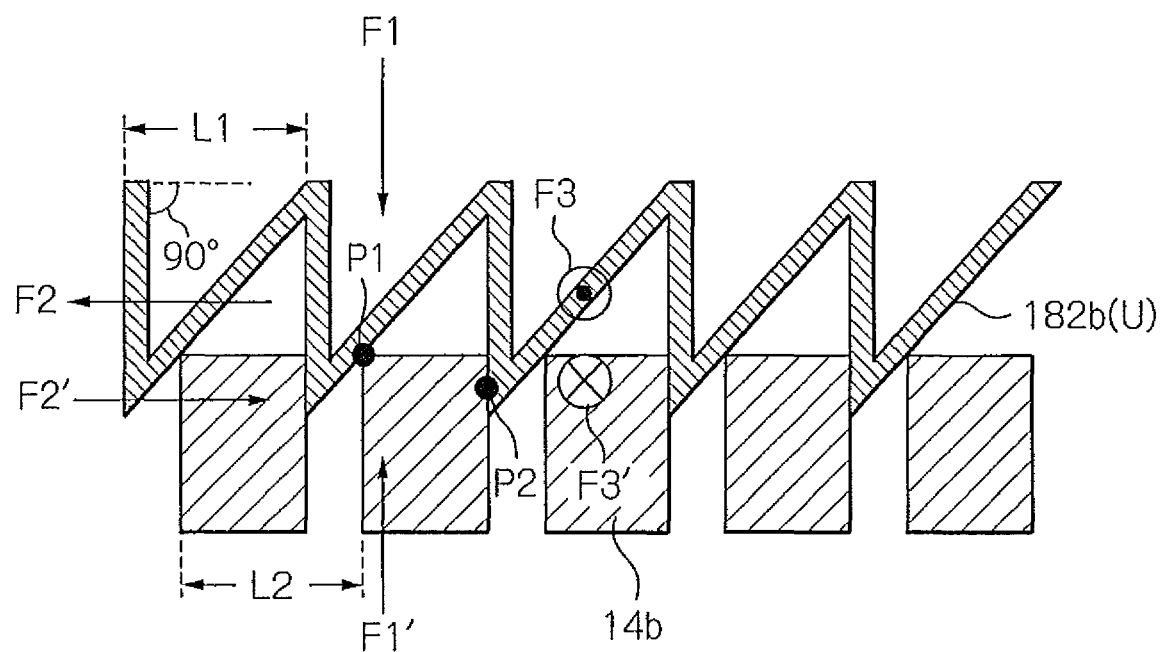
FIG. 11 is a cross-sectional view explaining the mating combination of the coupler and the mounting substrate of FIG. 10C.

Each of the upper power supplying uneven portions 182a(U) and 182b(U) has at least two right-angled triangular cross sections or knife-edge shaped cross sections along the press-fit direction of the coupler 18. In this case, the period L1 of the cross sections is larger than 0.1 mm to securely realize the strength of the upper power supplying uneven portions 182a (U) and 182*b*(U). On the other hand, each of the wiring pattern layers 14*a* and 14*b* has at least three rectangular cross sections along the press-fit direction of the coupler 18. In this case, the period L2 of the cross sections is also larger than 0.1 mm. For example, L1=L2 (see: FIG. 11).

The wiring pattern layers 14*a* and 14*b* are partly buried in the insulating layer 132, so that the wiring pattern layers 14*a* and 14*b* are hardly separated from the mounting substrate 131*a* even during a press-fit operation of the coupler 18.

The above-mentioned wiring pattern layers 14*a* and 14*b* can be formed by a pressing and etching process (see: JP-8-222838A). For example, an about 0.1 to 1.0 mm thick Cu layer is put on a thin Cu foil. Then, the thick Cu layer and the thin Cu foil are punched so that punched pieces of the thick Cu layer are press-fitted into the thin Cu foil. Then, the thin Cu foil with the punched pieces of the thick Cu layer are adhered by an adhesive resin layer as an insulating layer 32 to a metal substrate 31. Finally, the thin Cu foil is etched out so as to leave the punched pieces of the thick Cu layer as the wiring pattern layers 14*a* and 14*b*.

The lower power supplying uneven portions 182*a*(L) and 182*b*(L) have the same structures as the upper power supplying uneven portions 182*a*(U) and 182*b*(U). On the other hand, the bottom surface of the metal substrate 131 has a similar cross section to the wiring pattern layers 14*a* and 14*b*.

During a press-fit operation, when the mounting substrate 13 is pressed into the coupler 18, the oxide of the wiring pattern layers 14*a* and 14*b* and the oxide of the upper power supplying uneven portions 182*a*(U) and 182*b*(U) could break, so that metal diffusion would occur between the Au, Sn or their alloy of the wiring pattern layers 14*a* and 14*b* and that of the upper power supplying uneven portions 182*a*(U) and 182*b*(U) due to the frictional heat. In this case, the above-mentioned metal diffusion is enhanced by the cushioning characteristics of the upper power supplying uneven portions 182*a*(U) and 182*b*(U) to further press the upper power supplying uneven portions 182*a*(U) and 182*b*(U) against the wiring pattern layers 14*a* and 14*b*, respectively.

Simultaneously, the mechanical fixation of the coupler 18 to the mounting substrate 13 is enhanced by the deep contact between the lower power supplying uneven portions 182*a*(L) and 182*b*(L) and the uneven surface of the metal substrate 31.

Thus, the mechanical fixation of the coupler 18 to the mounting substrate 13 is carried out by the mating combination of the wiring pattern layers 14*a* and 14*b* and the upper power supplying uneven portions 182*a*(U) and 182*b*(U) and the mating combination of the metal substrate 31 and the lower power supplying uneven portions 182*a*(L) and 182*b*(L).

The mechanical fixation of the coupler 18 to the mounting substrate 13 is discussed in more detail below with reference to FIG. 11.

As illustrated in FIG. 11, the upper power supplying uneven portion 182*b*(U) is in contact with the wiring pattern layer 14*b* at a contact point P1 or P2.

That is, when a force F1 perpendicular to the press-fit direction of the coupler 18 is applied to the upper power supplying uneven portion 182*b*(U) while a force F1' perpendicular to the press-fit direction and opposite to the force F1 is applied to the wiring pattern layer 14*b*, a sloped face of the upper power supplying uneven portion 182*b*(U) is in contact with an edge of the wiring pattern layer 14*b* at the contact point P1. Thus, the metal diffusion between the upper power supplying uneven portion 182*b*(U) and the wiring pattern layer 14*b* is enhanced, thus exhibiting an excellent electrical connection therebetween.

Also, when a force F2 opposite to the press-fit direction of the coupler 18 is applied to the upper power supplying uneven portion 182*b*(U) while a force F2' opposite to the force F2 is applied to the wiring pattern layer 14*b*, a perpendicular face of the upper power supplying uneven portion 182*b*(U) is in contact with a perpendicular face of the wiring pattern layer 14*b* at the contact point P2. Thus, the metal diffusion between the upper power supplying uneven portion 182*b*(U) and the wiring pattern layer 14*b* is enhanced regardless of the stationary frictional force, thus exhibiting an excellent electrical connection therebetween.

Note that the contact at the contact point P2 is due to the right-angled triangular cross sections of the upper power supplying uneven portion 182*b*(U). If the upper power supplying uneven portion 182*b*(U) has isosceles triangular cross sections such as alligator clips of JP-2006-300877A and the forces F2 and F2' are sufficiently large, the alligator clips would be opened.

Further, even when a force F3 perpendicular to the press-fit direction of the coupler 8 as indicated by an arrow mark is applied to the upper power supplying uneven portion 182*b*(U) while a force F3' perpendicular to the press-fit direction of the coupler 18 as indicated by another arrow mark opposite to the force F3 is applied to the wiring pattern layer 14*b*, since an edge of the upper power supplying uneven portion 182*b*(U) is in contact with an edge of the wiring pattern layer 14*b*, the metal diffusion between the upper power supplying uneven portion 182*b*(U) and the wiring pattern layer 14*b* is maintained. Note that, even when the above-mentioned force F3 is applied to the wiring pattern layer 14*b* while the above-mentioned force F3' is applied to the upper power supplying uneven portion 182*b*(U), the metal diffusion between the upper power supplying uneven portion 182*b*(U) and the wiring pattern layer 14*b* is maintained. In both cases, an excellent electrical connection can be exhibited.

The dimensions and shapes of the power supplying uneven portions 182*a* and 182*b* and the wiring pattern layers 14*a* and 14*b* actually fluctuate due to the manufacturing steps. However, if the fluctuation of these dimensions and shapes is small, the metal diffusion between the upper power supplying uneven portion such as 182*b*(U) and the wiring pattern layer such as 14*b* is still enhanced, thus exhibiting an excellent electrical connection therebetween.

Figure 12A:
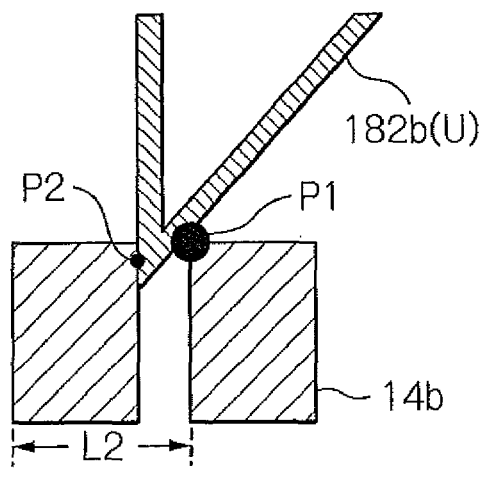
FIGS. 12A and 12B are cross-sectional views for explaining the fluctuation of the period of the wiring pattern layer of FIG. 10C.
Figure 12B:
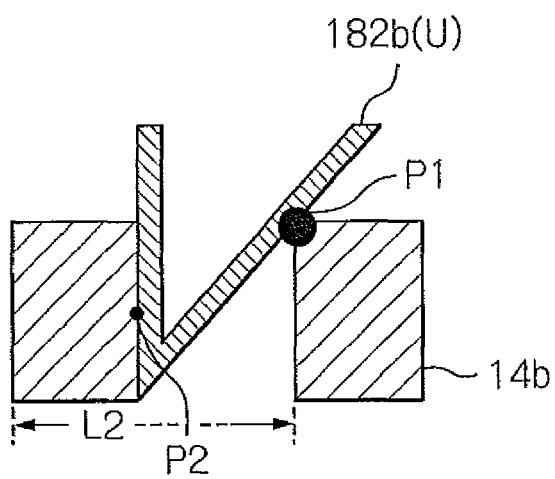

First, even when the period L2 of the wiring pattern layer 14*b* is a little smaller as illustrated in FIG. 12A or a little larger as illustrated in FIG. 12B, a sloped face of the upper power supplying uneven portion 182*b*(U) is in contact with an edge of the wiring pattern layer 14*b* at a contact point P1. Also, a perpendicular face of the upper power supplying uneven portion 182*b*(U) is in contact with a perpendicular face of the wiring pattern layer 14*b* at a contact point P2. Thus, the metal diffusion between the upper power supplying uneven portion 182*b*(U) and the wiring pattern layer 14*b* is enhanced, thus exhibiting an excellent electrical connection therebetween.

In FIGS. 12A and 12B, note that the deviation of the period L2 of the wiring pattern layer 14*b* from a desired value is very small; however, this deviation is exaggerated for better understanding.

Figure 13A:
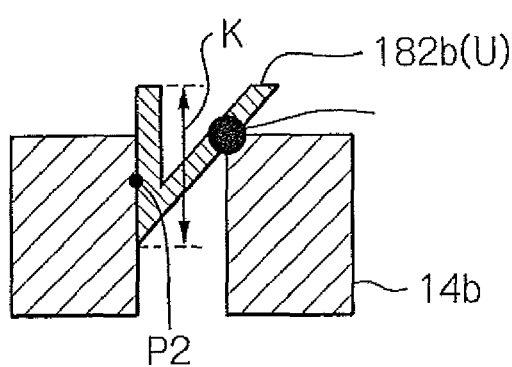
FIGS. 13A and 13B are cross-sectional views for explaining the fluctuation of the knife-edge length of the upper power supplying uneven portion of FIG. 10C.
Figure 13B:
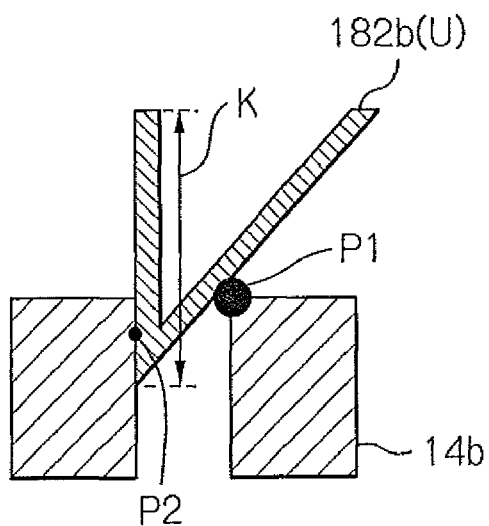

Next, even when the knife-edge length K of the upper power supplying uneven portion 182*b*(U) is a little smaller as illustrated in FIG. 13A or a little larger as illustrated in FIG. 13B, a sloped face of the upper power supplying uneven portion 182*b*(U) is in contact with an edge of the wiring pattern layer 14*b* at a contact point P1. Also, a perpendicular face of the upper power supplying uneven portion 182*b*(U) is in contact with a perpendicular face of the wiring pattern layer 14*b* at a contact point P2. Thus, the metal diffusion between the upper power supplying uneven portion 182*b*(U) and the wiring pattern layer 14*b* is enhanced, thus exhibiting an excellent electrical connection therebetween.

In FIGS. 13A and 13B, note that the deviation of the knife-edge length K of the wiring pattern layer 14 from a desired value is very small; however, this deviation is exaggerated for better understanding.

Figure 14A:
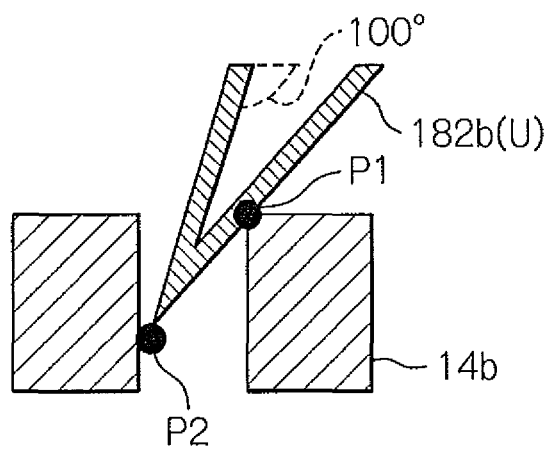
FIGS. 14A and 14B are cross-sectional views for explaining the fluctuation of the angle of the upper power supplying uneven portion of FIG. 10C.
Figure 14B:
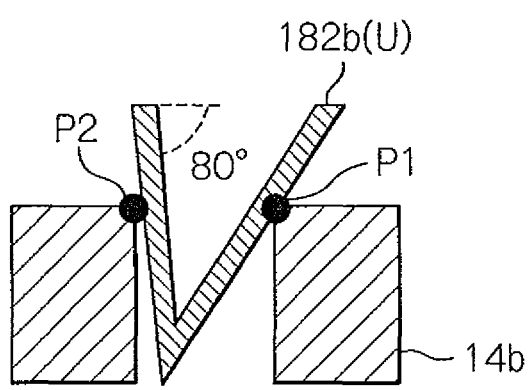

Next, even when the angle of the upper power supplying uneven portion 182*b*(U) is a little larger, i.e., 100° as illustrated in FIG. 14A or a little smaller, i.e., 80° as illustrated in FIG. 14B, a sloped face of the upper power supplying uneven portion 182*b*(U) is in contact with an edge of the wiring pattern layer 14*b* at a contact point P1. Also, an edge of the upper power supplying uneven portion 182*b*(U) is in contact with a perpendicular face or edge of the wiring pattern layer 14*b* at a contact point P2. Thus, the metal diffusion between the upper power supplying uneven portion 182*b*(U) and the wiring pattern layer 14*b* is enhanced, thus exhibiting an excellent electrical connection therebetween.

In FIGS. 14A and 14B, note that the deviation of the angle of the wiring pattern layer 14 from 90° is very small; however, this deviation is exaggerated for better understanding.

Figure 15A:
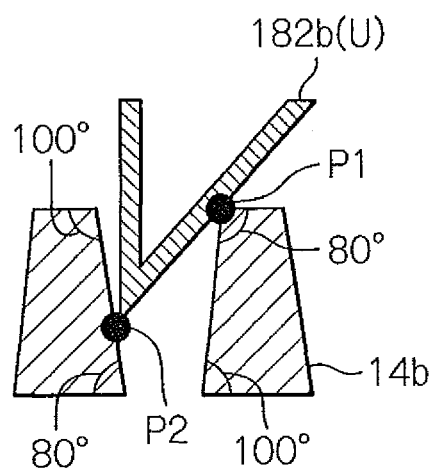
FIGS. 15A and 15B are cross-sectional views for explaining the fluctuation of the shape of the wiring pattern layer of FIG. 10C.
Figure 15B:
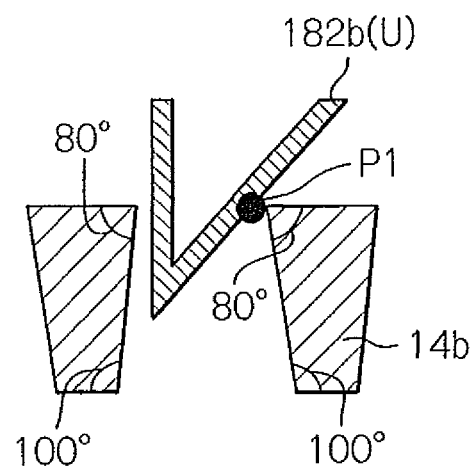

Finally, even when the shape of the wiring pattern layer 14*b* is a little deviated as illustrated in FIG. 15A or FIG. 15B, a sloped face of the upper power supplying uneven portion 182*b*(U) is in contact with an edge of the wiring pattern layer 14*b* at a contact point P1. Also, an edge of the upper power supplying uneven portion 182*b*(U) is in contact with a perpendicular face of the wiring pattern layer 14*b* at a contact point P2. Thus, the metal diffusion between the upper power supplying uneven portion 182*b*(U) and the wiring pattern layer 14*b* is enhanced, thus exhibiting an excellent electrical connection therebetween.

In FIGS. 15A and 15B, note that the deviation of the shape of the wiring pattern layer 14 from a desired value is very small; however, this deviation is exaggerated for better understanding.

Thus, in the second embodiment, in addition to the effect of the first embodiment, the mechanical fixation of the coupler 18 to the mounting substrate 13 can be enhanced by the mating combination of the wiring pattern layers 14*a* and 14*b* and the upper power supplying uneven portions 182*a*(U) and 182*b*(U) and the mating combination of the metal substrate 31 and the lower power supplying uneven portions 182*a*(L) and 182*b*(L).

The press-fit operation of the coupler 18 to the mounting substrate 13 is explained next with reference to FIGS. 16A and 16B.

Figure 16A:
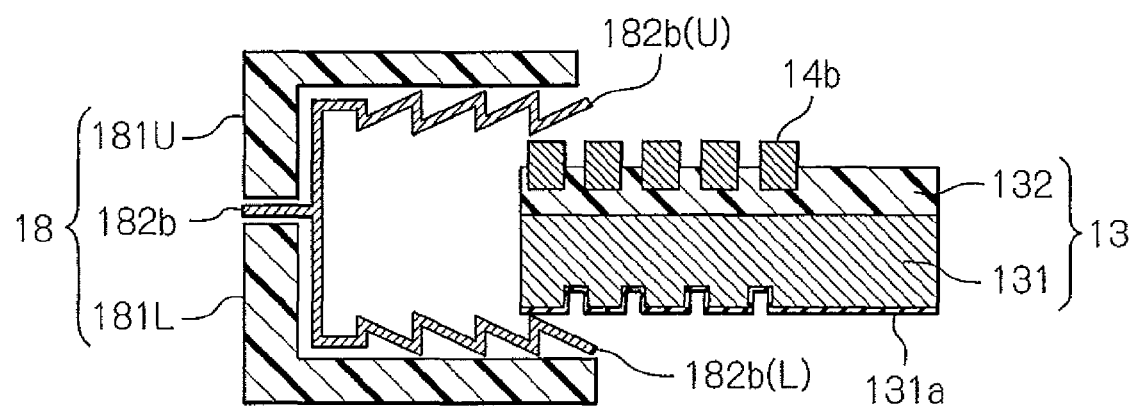
FIGS. 16A and 16B are cross-sectional views for explaining a press-fit operation of the coupler to the mounting substrate of FIG. 10C.
Figure 16A:
Figure 16B:
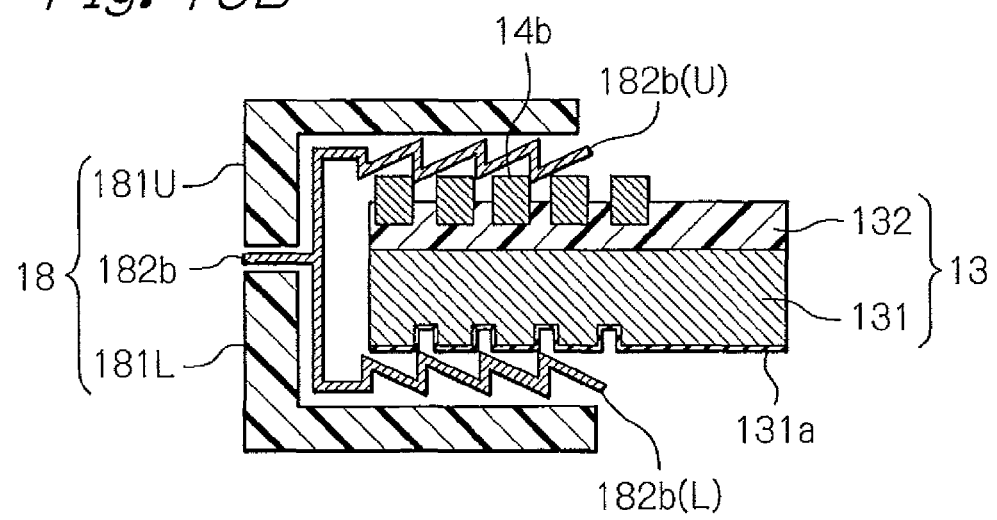

First, referring to FIG. 16A, when the edges of the power supplying uneven portions such as 182*b*(U) and 182*b*(L) are in contact with the wiring pattern layer 14*b* and the metal substrate 31, respectively, the power supplying uneven portions 182*b*(U) and 182*b*(L) are opened due to the cushioning characteristics thereof.

Then, the press-fit operation is continued, so that the power supplying uneven portions 182*b*(U) and 182*b*(L) are put completely on the wiring pattern layer 14*b* and the metal substrate 31, respectively, to form a mating combination, which would make a sound. Therefore, the completion of the press-fit operation can easily recognize such a mating combination by hearing such a sound.

In the above-described second embodiment, the angle of the triangular cross-section of the power supplying uneven portions 182*a*(U), 182*a*(L), 182*b*(U) and 182*b*(L) is 90°; however, this angle can be from 80° to 100°, since a frictional force between the power supplying uneven portion such as 182*b*(U) and the wiring pattern layer such as 14*b* is very small.

Figure 17:
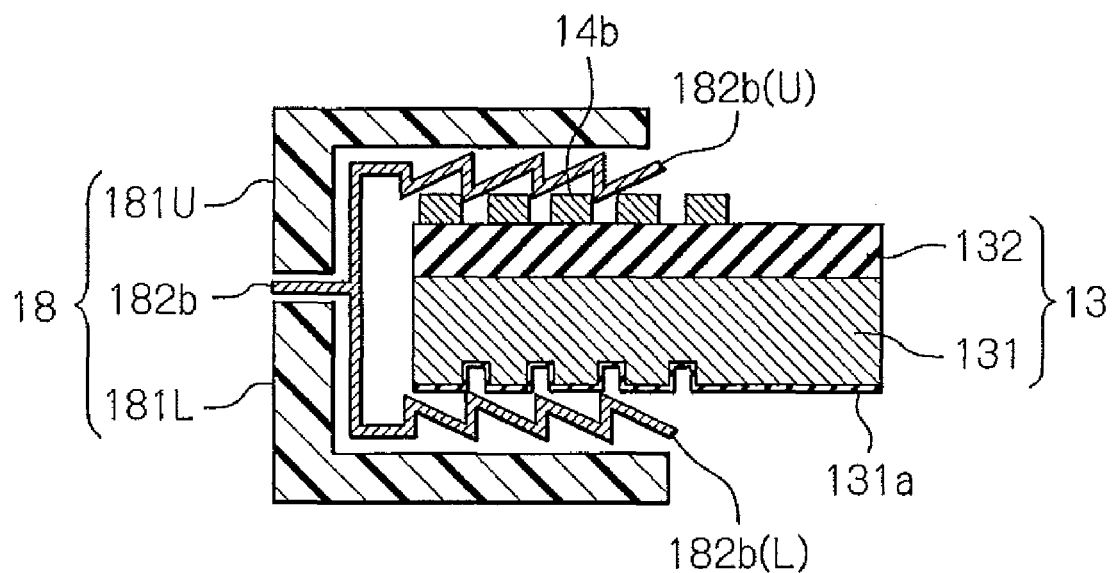
FIGS. 17 and 18 are cross-sectional views illustrating modifications of the optical semiconductor device module of FIG. 10C.

Also, in the above-described second embodiment, although the wiring pattern layers 14*a* and 14*b* are partly buried in the insulating layer 132, the wiring pattern layers 14*a* and 14*b* can be formed on the insulating layer 132 by using a plating and etching process as illustrated in FIG. 17.

Figure 18:
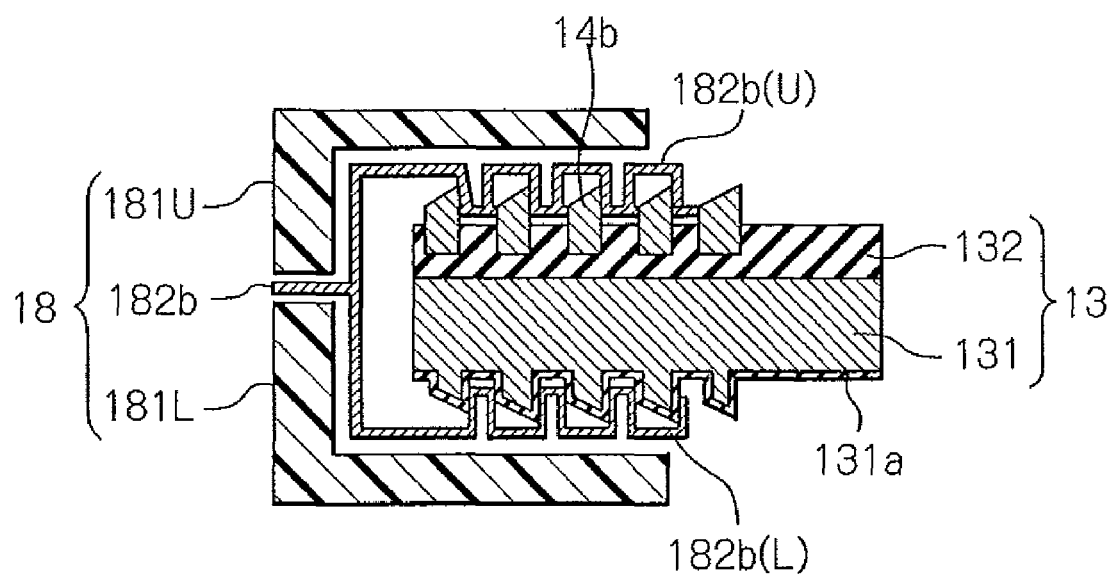

Further, in the above-described second embodiment, the cross-section of the power supplying uneven portion such as 182*b*(U) can be rectangular and the cross-section of the wiring pattern layer such as 14*b* can be right-angled triangular, to form a mating combination as illustrated in FIG. 18. In this case, the right-angled rectangles of the wiring pattern layer 14*b* and the metal substrate 131 are opposite to the right-angled rectangular of the power supplying uneven portions 182*b*(U) and 182*b*(L) of FIG. 10C, so that the coupler 18 is hardly separated from the mounting substrate 13 after the press-fit operation.

Figure 19A:
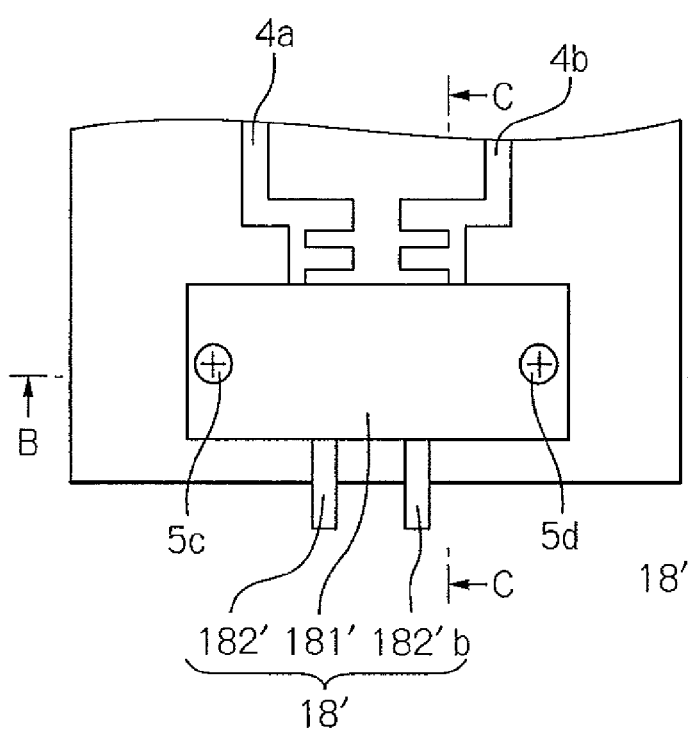
FIG. 19A is a plan view illustrating a second embodiment of the optical semiconductor device module according to the presently disclosed subject matter.
Figure 19C:
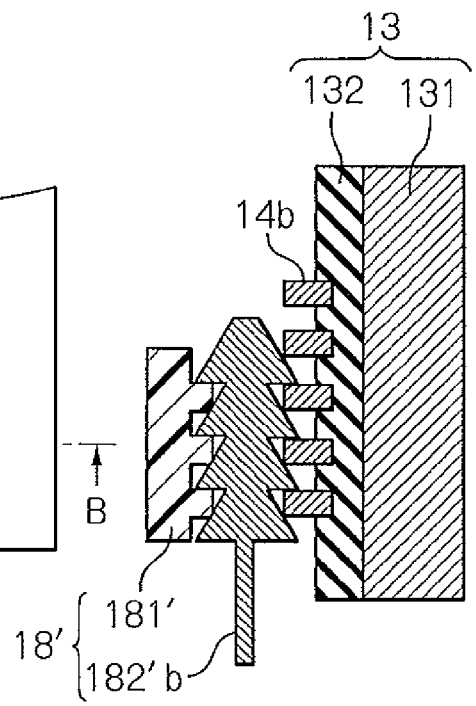
FIG. 19C is a cross-sectional view taken along the line C-C of FIG. 19A.
Figure 19B:
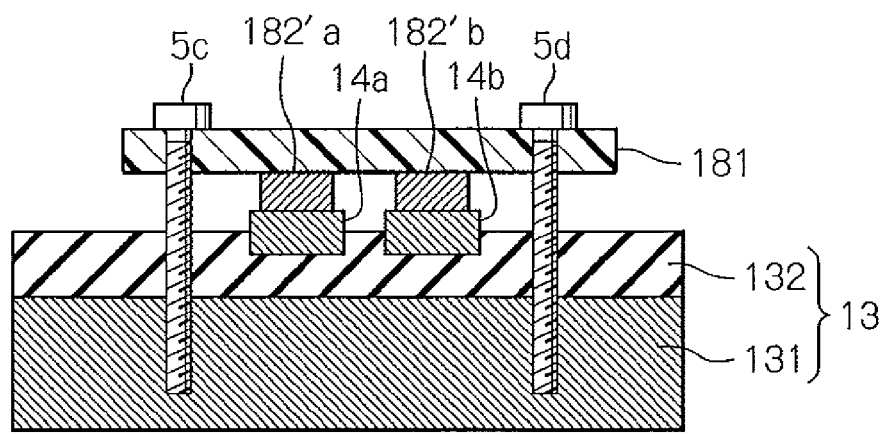
FIG. 19B is a cross-sectional view taken along the line B-B of FIG. 19A.

FIG. 19A is a plan view illustrating a third embodiment of the optical semiconductor device module according to the presently disclosed subject matter, FIG. 19B is a cross-sectional view taken along the line B-B of FIG. 19A, and FIG. 19C is a cross-sectional view taken along the line C-C of FIG. 19A. Note that FIGS. 19A, 19B and 19C corresponding to FIGS. 10A, 10B and 10C, respectively. Therefore, FIGS. 19A, 19B and 19C illustrate only the vicinity of a coupler. Even in the third embodiment, note that the LED element 1 and the like are provided in the same way as in the first embodiment.

As illustrated in FIGS. 19A, 19B and 19C, a coupler 18' is constructed by a housing 181' corresponding to the upper portion 181U of the housing 181 of FIGS. 10A, 10B and 10C, and power supplying uneven portions 182'*a* and 182'*b* corresponding to the upper power supplying uneven portions 182*a*(U) and 182*b*(U), respectively, of FIGS. 10A, 10B and 10C.

The housing 181' is fixed directly to the mounting substrate 13 by the screws 5*c* and 5*d*.

Each of the power supplying uneven portions 182'*a* and 182'*b* has at least two right-angled triangular cross sections or knife-edge shaped cross sections along the press-fit direction of the coupler 18' on each side. In this case, the period of the cross sections is larger than 0.1 mm to securely realize the strength of the power supplying uneven portions 182'*a* and 182'*b*. On the other hand, each of the wiring pattern layers 14*a* and 14*b* has at least three rectangular cross sections along the press-fit direction of the coupler 18. Additionally, housing 181' has at least three rectangular cross sections of the wiring pattern layers 14*a* and 14*b* and the housing 181' corresponding to those of the knife-edge shaped cross sections of the power supplying uneven portions 182'*a* and 182'*b*.

During a press-fit operation, when the mounting substrate 13 is pressed into the coupler 18, the oxide of the wiring pattern layers 14*a* and 14*b* and the oxide of the power supplying uneven portions 182'*a* and 182'*b* could break, so that metal diffusion would occur between the Au, Sn or their alloy of the wiring pattern layers 14*a* and 14*b* and that of the power supplying uneven portions 182'*a* and 182'*b* due to the frictional heat. In this case, the above-mentioned metal diffusion is enhanced by the cushioning characteristics of the power supplying uneven portions 182'*a* and 182'*b* to further press the power supplying uneven portions 182'*a* and 182'*b* against the wiring pattern layers 14*a* and 14*b*, respectively.

Simultaneously, the mechanical fixation of the coupler 18 to the mounting substrate 13 is enhanced by fixing the housing 181' to the mounting substrate 13 using the screws 5*c* and 5d to form a mating combination of the housing 181' and the power supplying uneven portions 182'a and 182'b.

Thus, the mechanical fixation of the coupler 18 to the mounting substrate 13 is carried out by the mating combination of the wiring pattern layers 14a and 14b and the power supplying uneven portions 182'a and 182'b and the mating combination of the housing 181' and the power supplying uneven portions 182'a and 182'b.

Thus, in the third embodiment, in addition to the effect of the first embodiment, the mechanical fixation of the coupler 18 to the mounting substrate 13 can be enhanced by the mating combination of the wiring pattern layers 14a and 14b and the power supplying uneven portions 182'a and 182'b and the housing 181' and the power supplying uneven portions 182'a and 182'b.

Even in the above-described third embodiment, the angle of the triangular cross section of the power supplying uneven portions 182'a and 182'b is 90°; however, this angle can be from 80° to 100°, since a frictional force between the power supplying uneven portion such as 182'b and the wiring pattern layer such as 14b is very small.

Also, in the above-described third embodiment, although the wiring pattern layers 14a and 14b are partly buried in the insulating layer 132, the wiring pattern layers 14a and 14b can be formed on the insulating layer 132 by using a plating and etching process as illustrated in FIG. 17.

Figure 20:
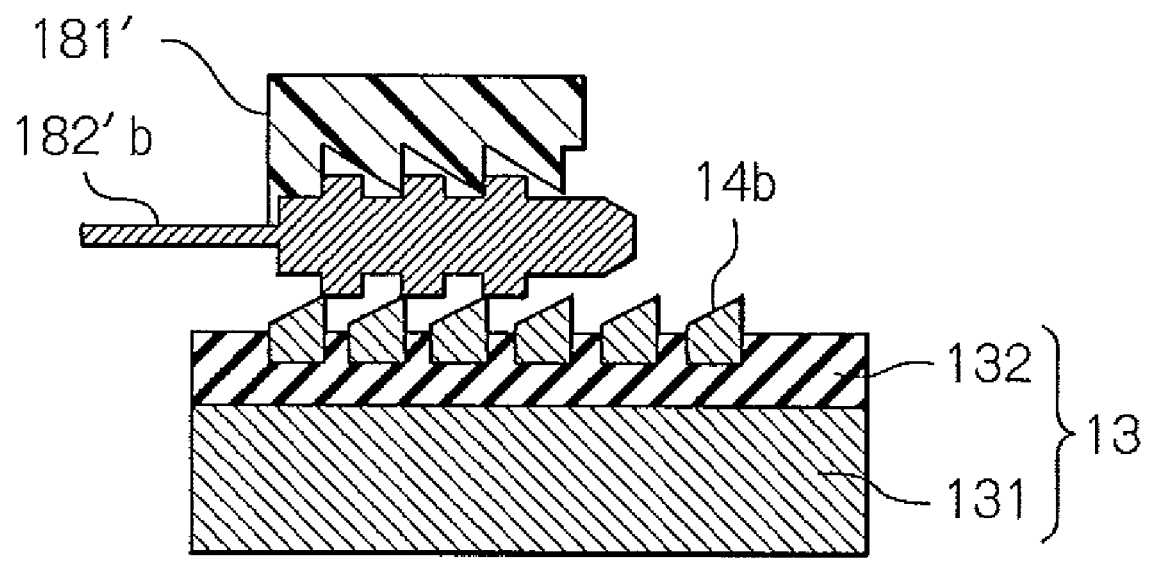
FIG. 20 is a cross-sectional view of a modification of FIG. 19C.

Further, in the above-described third embodiment, the cross-section of the power supplying uneven portion such as 182'b can be rectangular and the cross section of the wiring pattern layer such as 14b and the housing 181' can be right-angled triangular, to form a mating combination as illustrated in FIG. 20. In this case, the right-angled rectangles of the wiring pattern layer 14b and the coupler 18 are opposite to the right-angled rectangular of the power supplying uneven portion 182'b of FIG. 19C, so that the coupler 18 is hardly separated from the mounting substrate 13 after the press-fit operation.

It will be apparent to those skilled in the art that various modifications and variations can be made in the presently disclosed subject matter without departing from the spirit or scope of the invention. Thus, it is intended that the presently disclosed subject matter cover the modifications and variations of the presently disclosed subject matter provided they come within the scope of the appended claims and their equivalents. All related or prior art references described above and in the Background section of the present specification are hereby incorporated in their entirety by reference.

The invention claimed is:

1. An optical semiconductor device module, comprising:
   an optical semiconductor device having a light emitting portion on its top surface;
   a mounting substrate adapted to mount said optical semiconductor device thereon;
   at least one wiring pattern layer formed on a front surface of said mounting substrate; and
   at least one power supplying portion in contact with said wiring pattern layer,
   said power supplying portion and said wiring pattern layer are respectively shaped to form an interlocking combination.

2. The optical semiconductor device module as set forth in claim 1, wherein said power supplying portion is made of conductive material.

3. The optical semiconductor device module as set forth in claim 1, wherein said power supplying portion includes a metal film on its surface.

4. The optical semiconductor device module as set forth in claim 3, wherein said metal film includes one of gold (Au), tin (Sn) and their alloy.

5. The optical semiconductor device module as set forth in claim 3, wherein said wiring pattern layer includes another metal film on its surface, material of said another metal film being the same as that of said metal film, so that said power supplying portion and said wiring pattern layer are connected by metal diffusion between said metal film of said power supplying portion and said another metal film of said wiring pattern layer.

6. The optical semiconductor device module as set forth in claim 1, further comprising at least one conductive leaf spring adapted to fix said optical semiconductor device to said mounting substrate and supply power to said optical semiconductor device,
   said leaf spring comprising a plurality of rectangularly-shaped terminals, natural frequencies of at least two of said rectangularly-shaped terminals being different from each other.

7. The optical semiconductor device module as set forth in claim 1, wherein said mounting substrate comprises a metal substrate.

8. The optical semiconductor device module as set forth in claim 7, wherein said power supplying portion comprises projections,
   said module further comprising a projection portion similar to said projections of said power supplying portion, said housing fixing said projection portion to a position of said mounting substrate where said wiring pattern layer is not formed.

9. The optical semiconductor device module as set forth in claim 1, further comprising a housing adapted to fix said power supplying portion to said mounting substrate by a mechanical element.

10. The optical semiconductor device module as set forth in claim 9, wherein said mechanical element comprises one of a screw, a rivet and a press pin.

11. The optical semiconductor device module as set forth in claim 1, wherein said wiring pattern layer is partly buried in said mounting substrate.

12. The optical semiconductor device module as set forth in claim 1, wherein said one of said power supplying portion and said wiring pattern layer has approximately right-angled triangular cross sections, and said other of said power supplying portion and said wiring pattern layer has approximately rectangular cross sections so that said power supplying portion and said wiring pattern layer form the interlocking combination.

13. The optical semiconductor device module as set forth in claim 1, wherein said power supplying portion has first approximately right-angled triangular cross sections and second approximately right-angled triangular cross sections and said wiring pattern layer has first approximately rectangular cross sections while second approximately rectangular cross sections are formed in a back surface of said mounting substrate, so that said first approximately right-angled triangular cross sections of said power supplying portion and said first approximately rectangular cross sections of said wiring pattern layer form a first interlocking combination, and said second approximately right-angled triangular cross sections of said power supplying portion and said second approximately rectangular cross sections of said mounting substrate form a second interlocking combination.

14. The optical semiconductor device module as set forth in claim 1, wherein said power supplying portion has first approximately rectangular cross sections and second approximately rectangular cross sections and said wiring pattern layer has first approximately right-angled triangular cross sections while second approximately right-angled triangular cross sections are formed in a back surface of said mounting substrate, so that said first approximately rectangular cross sections of said power supplying portion and said first approximately right-angled triangular cross sections of said wiring pattern layer form a first mating combination, and said second approximately rectangular cross sections of said power supplying portion and said second approximately right-angled triangular cross sections of said mounting substrate form a second mating combination.

15. The optical semiconductor device module as set forth in claim 1, further comprising a housing, wherein said power supplying portion has first approximately right-angled triangular cross sections and second approximately right-angled triangular cross sections opposing each other, and said wiring pattern layer has first approximately rectangular cross sections while said housing has second approximately rectangular cross sections, so that said first approximately right-angled triangular cross sections of said power supplying portion and said first approximately rectangular cross sections of said wiring pattern layer form a first interlocking combination, and said second approximately right-angled triangular cross sections of said power supplying portion and said second approximately rectangular cross sections of said housing form a second interlocking combination.

16. The optical semiconductor device module as set forth in claim 1, further comprising a housing, wherein said power supplying portion has first approximately rectangular cross sections and second approximately rectangular cross sections opposing each other and said wiring pattern layer has first approximately right-angled triangular cross sections while said housing has second approximately right-angled triangular cross sections, so that said first approximately rectangular cross sections of said power supplying portion and said first approximately right-angled triangular cross sections of said wiring pattern layer form a first interlocking combination, and said second approximately rectangular cross sections of said power supplying portion and said second approximately right-angled triangular cross sections of said mounting substrate form a second interlocking combination.

* * * * *